United States Patent [19]

Shortes et al.

[11] 4,341,592

[45] Jul. 27, 1982

[54] METHOD FOR REMOVING PHOTORESIST LAYER FROM SUBSTRATE BY OZONE TREATMENT

[75] Inventors: Samuel R. Shortes, Lewisville; Thomas C. Penn, Richardson, both of Tex.

[73] Assignee: Texas Instruments Incorporated, Dallas, Tex.

[21] Appl. No.: 601,861

[22] Filed: Aug. 4, 1975

[51] Int. Cl.³ .................. B44C 1/22; C03C 15/00; C23F 1/00; H01L 21/306
[52] U.S. Cl. ............................ 156/643; 156/646; 430/328; 430/329; 430/330; 430/432
[58] Field of Search .............. 96/35, 35.1, 36, 36.2, 96/86 P, 115 R, 115 P; 156/643, 646; 427/38, 39

[56] References Cited

PUBLICATIONS

MESA APR 1000, Allied Chemical Brochure, Nov. 1973, pp. 1 to 3.
Holloway et al., Chemical Abstracts, v. 82, p. 420,197a.

Primary Examiner—Edward C. Kimlin
Attorney, Agent, or Firm—William E. Hiller; Melvin Sharp; James T. Comfort

[57] ABSTRACT

Method and apparatus for removing a photoresist layer from a substrate surface of different material, such as a semiconductor slice, in the fabrication of an electronic structure, involving exposure of the photoresist layer to an ozone-containing gaseous atmosphere in a reaction zone of a reactor. The ozone is present as an active reagent in the gaseous atmosphere to which the layer of photoresist material is exposed in an amount sufficient to react with all of the photoresist material in the layer thereof, with the photoresist material being removed from the underlying substrate surface in response to its exposure to the ozone. The photoresist material being treated by the ozone for stripping thereof may be either a negative or positive photoresist. Gaseous reaction products resulting from treatment of the substrate and removal of the photoresist layer therefrom are directed through an ozone reduction chamber prior to the discharge of the exhaust gases created by the reaction of the ozone with the photoresist material, wherein any excess ozone contained in the exhaust gases is reduced to molecular oxygen.

3 Claims, 27 Drawing Figures

Shipley A-Z 1350 Positive Resist
Incremental Removal For Various Temperatures

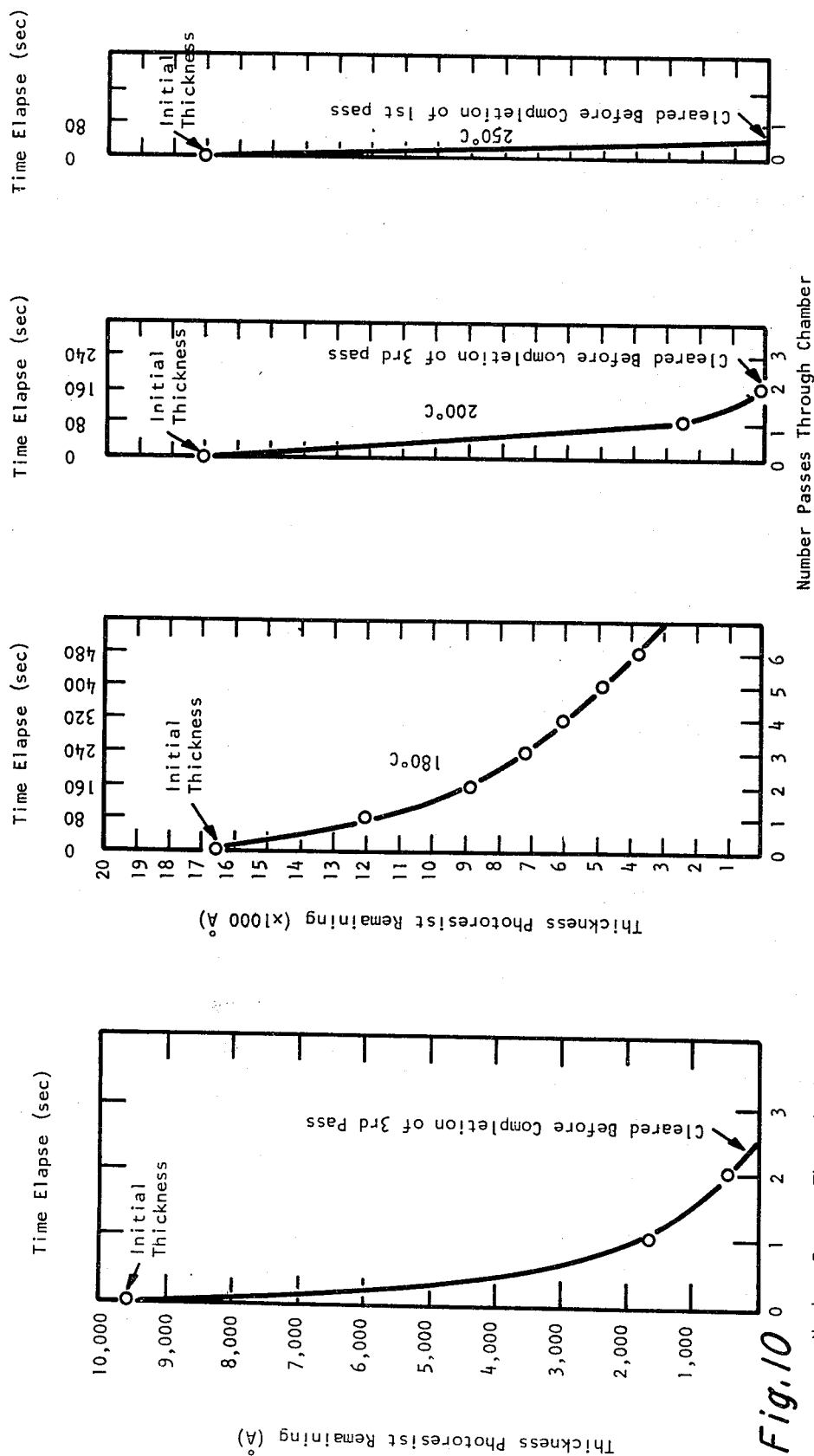

Shipley A-Z 1350
Resist Removal Vs. Ozone Concentration

GAF PR-301 Photoresist
Resist Removal Vs. Ozone Concentration

Waycoat Negative Resist
Resist Removal Vs. Ozone Concentration  *Fig. 14*

Shipley A-Z 1350
Resist Removal Vs. Flow Rate

Waycoat Negative Resist
Resist Removal Vs. Flow Rate

Shipley A-Z 1350
Resist Removed vs. Translation Speed

GAF PR-301 Photoresist
Resist Removed Vs. Translation Speeds

Waycoat Negative Photoresist
Resist Removal Vs. Translation Speed

METHOD FOR REMOVING PHOTORESIST LAYER FROM SUBSTRATE BY OZONE TREATMENT

This invention concerns a method and apparatus for removing or stripping a layer of photoresist material from a substrate surface of different material, such as a semiconductor slice, in the fabrication of an electronic structure, such as a discrete semiconductor device including transistors, diodes, etc. or an integrated circuit, wherein the removal of the layer of photoresist material is accomplished by subjecting same to an ozone treatment through the exposure of the photoresist layer to an ozone-containing gaseous atmosphere. The ozone is present in the gaseous atmosphere as an active reagent in an amount sufficient to react with all of the photoresist material in the layer thereof to be removed.

Photoresist materials are commonly used in a wide number of industrial processes where it is desired to provide detailed patterns on a substrate surface in thin films applied thereto or to provide regions of altered character as contrasted to other surface portions of the substrate. Such photoresist materials are photosensitive in nature, being characterized by a differential reactivity to specific liquid solvents after exposure to an energy source, such as ultra-violet radiation for example. A standard photographic practice in employing photoresist layers as patterns involves the application of a layer of photoresist material to a substrate, followed by the selective exposure of the photoresist layer to an energy source, wherein portions of the photoresist layer are changed in character due to their exposure to the energy source. After such exposure, the photoresist layer is then developed by a "wet development process" employing liquid chemical solvents to selectively remove portions of the photoresist for providing the desired pattern therein. Negative and positive photoresist materials are available for this purpose. In a negative photoresist material, the portion of a layer thereof exposed to the energy source is changed in its chemical character being polymerized as contrasted to the non-exposed portion and rendering it insoluble with respect to the liquid chemical solvent which removes the non-exposed portion of the negative photoresist layer in producing the desired pattern therein. For a positive photoresist layer, the situation is reversed in that the portion thereof exposed to the energy source is rendered soluble to the liquid solvent, while the non-exposed portion is insoluble with respect thereto and remains after development in forming the desired pattern.

Stripping of the pattened photoresist layer becomes necessary in most instances in the fabrication of an electronic structure after its purpose in providing a patterned mask, such as for application of a thin film to the underlying substrate surface or the application of dopant materials to selected regions of the substrate, for example. Many fabrication processes for manufacturing discrete electronic devices and integrated circuits require repeated uses of photoresist layers at various stages of the process before the electronic structure is completed. Removal or stripping of each photoresist layer after it has served its purpose in the fabrication of the electronic structure is required before the additional stages in the fabrication process may be accomplished, or at least as the final stage in completing the fabrication of the electronic structure.

Many different types of "wet" solvent developers have been employed to remove exposed or unexposed portions of a photoresist layer from an underlying substrate surface. Typical of such wet developers are the hydrogen peroxide-sulfuric acid developers and those based on phenol-methyl ethyl ketone and trichloroethylene. In the hydrogen peroxide-sulfuric acid system, a mixture of 10 to 33.3% of hydrogen peroxide and 66.6–90% of sulfuric acid can be used for the complete removal of the photoresist after acid etching on the exposed portion of the underlying substrate surface to be patterned has been completed. In general, such a system may be used for all photoresist removal processes except those requiring removal of a photoresist layer from an aluminum surface, since this particular system will dissolve aluminum. Inherent in the use of these chemicals is the problem of contamination from inorganic ions, which remain on the resist patterned substrate, commonly referred to as the "slice", after the development of the pattern is complete. This contamination results in additional chemical treatment being required of the developed slices for removal of such contamination involving further time, handling and expense in completing the fabrication of the electronic structure.

The class of wet developers based on phenol-methyl ethyl ketone and trichloroethylene are used on substrates having aluminum metalization layers, since this photoresist development and removal system does not chemically attack aluminum. However, development with this system is also time-consuming and is accompanied by a substantially high incidence of contamination.

Furthermore, use of a wet solvent developer is generally responsible for the production of some residual material from the removed photoresist layer which remains on the substrate surface. This residual material also is present along the edges of the photoresist pattern where it tapers down to the substrate surface causing a decrease in pattern resolution tending to render the pattern detail less sharp in outline.

A further problem peculiar to the etching of an aluminum layer on a substrate, wherein the aluminum layer is initially overlaid by a photoresist layer which is developed by a conventional wet developer to provide an etch pattern for exposed portions of the aluminum layer, is the generation of hydrogen bubbles by the chemical etchant in reacting with the aluminum metal. These hydrogen bubbles tend to form on the surface of the aluminum layer, particularly seeming to congregate around the residue left by the wet developer. Their presence prevents fresh acid from reaching the aluminum surface and inhibits proper etching thereof. Previously, various wetting agents and mechanical agitation have been employed to alleviate this problem with some success in that these means have facilitated the release of the hydrogen bubbles from the aluminum surface.

In addition to wet process development techniques for removing a layer of photoresist material, another technique which may be said to be based on a non-solvent or dry basis has heretofore been employed for the purpose of removing photoresist material. This technique employs plasma etching as obtained through an oxygen RF plasma process wherein the generated plasma containing monatomic oxygen as an active species is employed to remove the layer of photoresist material. A description of plasma etching for photoresist removal may be found in the article "A Dry Photoresist Removal Method", Irving, published in *Kodak*

*Photoresist Seminar Proceedings,* 1968 Edition, Vol. II, pps. 26-29. Generally, plasma containing atomic oxygen O may be generated by placing diatomic oxygen ($O_2$) molecules in an evaucated chamber and providing an electric field of sufficient force to disassociate the oxygen ($O_2$) molecules. These so-called plasma machines or "ashers" are generally AC systems operating at radio frequencies in the KHz range. Typically, two opposing horizontal flat electrode plates or tubular electrodes are employed for purposes of generating the plasma therebetween. As recognized in the art, the term "asher" is generally applied to an RF plasma machine employed for the purpose of removing photoresist material by plasma etching. This oxygen RF plasma technique, although effective to remove photoresist material, is characteristically slow, requiring from ten to thirty minutes for removal of the photoresist material and also commonly requiring batch processing rather than continuous processing, wherein individual slices or groups of slices must be loaded and unloaded in a batch procedure from a Bell jar. Furthermore, semiconductor slices incorporating MOS technology (metal-oxide-semiconductor technology) may be subject to degradation by the use of this technique for removing photoresist material therefrom because of their excessive sensitivity to electric fields.

The process of ozone treatment in accordance with the present invention is effective for removing or stripping a layer of photoresist material from the underlying surface of a substrate of different material in a rapid manner without the use of wet development solvents, while also subtantially alleviating problems of residual contamination and other problems unique to particular types of semiconductor slices, such as the problem engendered by the pesence of an aluminum film on a substrate on which hydrogen bubbles generated during the acid etching thereof may cling to the aluminum film to adversely affect the patterned etching thereof.

SUMMARY OF THE INVENTION

This invention is directed to a method and apparatus for removing a layer of photoresist material from a substrate surface of a different material, such as a semiconductor slice, in the fabrication of an electronic structure, wherein the removal of the layer of photoresist material is accomplished by exposing the photoresist layer to an ozone-containing gaseous atmosphere. The ozone is present in the gaseous atmosphere as an active reagent in an amount sufficient to react with all of the photoresist material included in the layer thereof. The substrate on which the photoresist layer is disposed is positioned in a reaction zone of a reactor into which the ozone-containing gaseous atmosphere is introduced. In some of its more specific aspects, the method contemplates the heating of the photoresist layer on the substrate to a predetermined temperature prior to its exposure to the ozone-containing gaseous atmosphere, the predetermined temperature to which the photoresist layer is heated being in the range of about 200°-250° C. Prior to its introduction into the reaction zone of the reactor, the ozone-containing gaseous atmosphere is maintained at approximately ambient temperature to substantially avoid breakdown of the ozone into molecular oxygen which tendency is heightened when the ozone is subjected to elevated temperatures of the order to which the photoresist layer to be stripped is heated. Thus, within the context of the invention, it is important to maintain a sufficient percentage of ozone molecules in the area of the photoresist layer to be removed thereby through oxidation thereof by avoiding the breakdown of the ozone molecules into molecular oxygen to the extent possible even though the elevated temperature to which the photoresist layer is heated has a beneficial effect in facilitating removal of the photoresist layer by the ozone. One mode of enhancing the stability of the ozone molecules in the ozone-containing gaseous atmosphere involves the use of a water jacket on the reactor surrounding the inlet tube to the reaction zone through which the ozone-containing gaseous atmosphere is introduced. Water is circulated through the water jacket to cool the inlet passage and the reservoir in which the ozone-containing gaseous atmosphere is disposed prior to its introduction into the reaction zone of the reactor.

A further mode of maintaining the ozone-containing gaseous atmosphere at approximately ambient temperature involves use of a reactor provided with individual confining cups for the respective substrates having photoresist layers thereon to be stripped therefrom. The individual confining cups are respectively provided with inlet passageways and are mounted in the housing wall of the reactor so as to be suspended over respective photoresist layer-bearing substrates. This arrangement permits the ozone-containing gaseous atmosphere to be immediately directed onto the photoresist layer of the substrate through the inlet passageway in the confining cup to minimize the exposure of the ozone-containing gaseous atmosphere to the elevated heat of the reaction zone prior to the contact of the ozone molecules with the photoresist layer.

Upon subjecting the photoresist layer of the substrate to an ozone-containing gaseous atmosphere, a reaction occurs in which the photoresist layer is oxidized by the ozone molecules resulting in its removal from the substrate as a fluid reaction product. The reaction products are passed through an ozone reduction chamber so that any excess ozone contained therein is reduced to molecular oxygen prior to discharging the exhaust gases to ambient atmosphere as a safety precaution because of the inherently dangerous nature of ozone. The ozone reduction chamber in a practical embodiment may include catalytic material in the form of silver mesh to facilitate the decomposition of ozone to molecular oxygen.

Reactor apparatuses suitable for practicing the ozone photoresist removal method include both batch types and continuous substrate types. A reactor of the continuous substrate feed type is provided with labyrinth seals at the entrance and exit sides of the reaction chamber where the photoresist layers are to be removed from the serially fed substrates. In this respect, the reactor housing is so constructed as to provide an outer passageway into which an inert gas, such as nitrogen or air, may be introduced at an increased pressure level as compared to the pressure of the gaseous reaction products being discharged from the reaction zone of the reactor. The exhaust passageway for the gaseous reaction products and any excess ozone contained therein is located inwardly with respect to the passageway containing inert gas, the construction being such that the inert gas is caused to be discharged in the area of the entrance to the exhaust passageway for the reaction products and the excess ozone at a higher pressure so as to form a curtain of inert gas blocking the movement of the reaction products and excess ozone outwardly from the reaction zone of the reactor and forcing the reaction products and excess ozone to conform to a discharge path extending through the exhaust passageway leading to the ozone reduction chamber.

The ozone treatment method herein disclosed has further significance in solving a problem peculiar to the etching of an aluminum layer on a substrate of different material, such as a semiconductor slice, wherein the aluminum layer is patterned through the use of a photoresist layer as developed by a conventional wet development technique. In this respect, the reaction of the typical acid etchant material with aluminum causes the generation of hydrogen bubbles which tend to cling to the surface of the aluminum layer, thereby preventing fresh acid etchant material from reaching the aluminum surface in areas where such hydrogen bubbles are present. By placing such slices having aluminum layers and developed photoresist thereon in an ozone containing-gaseous atmosphere for short time periods at a moderate temperature, any hydrogen bubbles that form during the reaction of the acid etchant material with the aluminum in the patterning of the aluminum layer are of relatively small size and are easily dispersed into the solution of reaction products. This technique is rapid and "de-scums" any residual photoresist material remaining on the portion of the aluminum layer to be removed by etching to clean the slice and improve the smoothness of the edge of a patterned aluminum line. Such a "flash" ozone treatment can be accomplished in a relatively short time, such as thirty seconds, for example, thereby affording an advantage in time and convenience as contrasted with conventional methods, such as the use of various wetting agents, and mechanical agitation of the slice for helping the hydrogen bubbles release from the aluminum surface.

The ozone treatment method of photoresist layer removal herein disclosed decreases the amount of residual photoresist material remaining on the substrate to such a degree, wherein rinsing of the substrate with an aqueous non-etchant solution, such as hot de-ionized water, will remove substantially all of the remaining residual material, thereby obviating the necessity for the use of further chemical reagents for this purpose.

Other features of the invention will be more fully understood from the following more detailed description as set forth in the specification when taken together with the accompanying drawings, in which:

FIG. 10 is a graph showing the removal rate of a layer of positive photoresist material different from that producing the data represented by the graphs of FIGS. 9a–9c caused by an ozone treatment at a particular temperature to which the photoresist layer is heated;

FIGS. 11a–11c are graphs showing the removal rate of a negative photoresist layer from a substrate upon being subjected to an ozone treatment in accordance with the present invention, wherein the reaction occurs at different temperatures;

Figure 1:
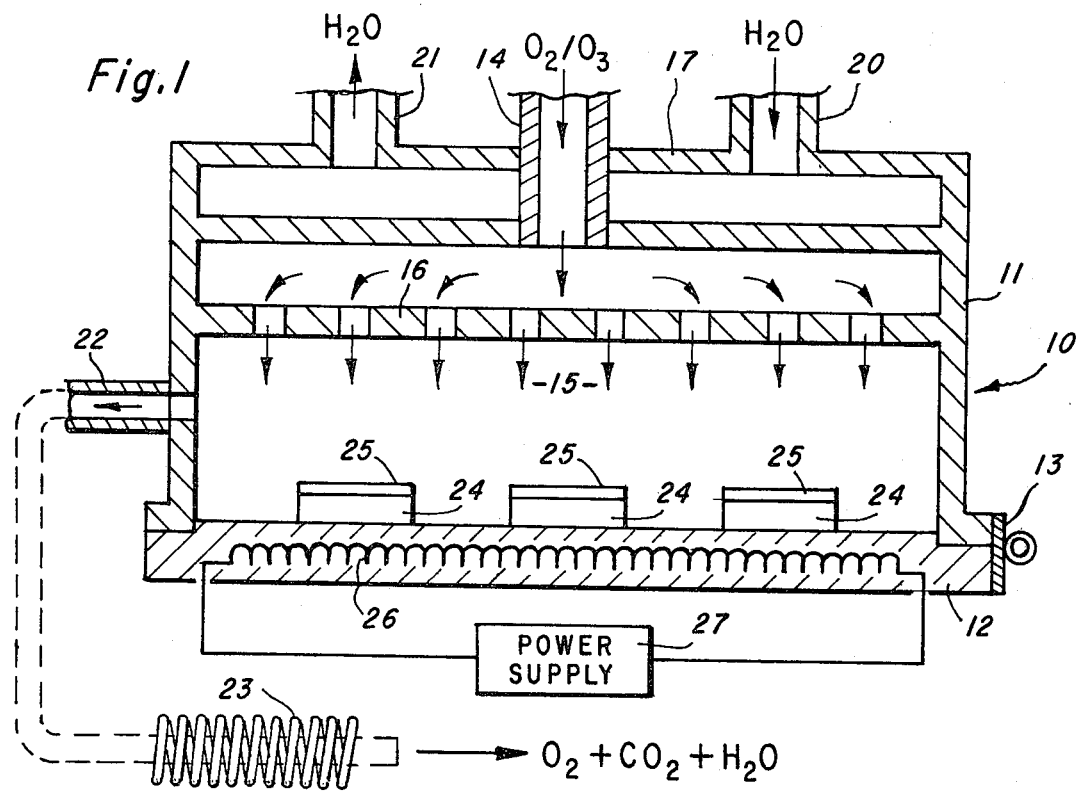
FIG. 1 is a sectional view, partially diagrammatic in character, of one embodiment of a reactor employed in the performance of an ozone treatment method for removing a layer of photoresist material from a substrate in accordance with the present invention.

Referring more specifically to the drawings, FIG. 1 illustrates one embodiment of a reactor suitable for practicing the method of photoresist layer removal by ozone treatment in accordance with the present invention. The reactor of FIG. 1 comprises a housing 10 of segmental character which includes an upper cover portion 11 pivotally mounted on a base 12 by suitable means, such as a hinge 13 connecting the cover 11 to the base 12. When the cover 11 is in its closed position as shown in FIG. 1, a fluid-tight seal is formed by suitable means (not shown) between the cover 11 and the base 12. The cover 11 is provided with an inlet 14 generally centrally located in the top wall portion of the cover 11 and communicating with an internal reaction chamber 15. Preferably, a perforated diffusion wall 16 is provided to form a partition between upper and lower regions of the internal chamber 15 to promote flow of gases introduced through the inlet 14 across the cross-sectional area of the chamber 15. A coolant jacket 17 is also provided on the cover 11 in surrounding relation to the inlet 14. The coolant jacket 17 includes an inlet 20 and an outlet 21 to permit cycling of coolant liquid or gas through the jacket 17 to control the temperature of the region including the inlet 14. The reaction chamber 15 is provided with an exhaust outlet 22 located beneath the perforated diffusion wall 16 and communicating with an ozone reducing scrubber 23 which discharges to the ambient atmosphere.

The base 12 of the reactor 10 serves as a substrate-supporting surface, wherein substrates having photoresist layers thereon are disposed within the internal chamber 15 of the reactor 10 in a reaction zone. The substrates 24 have respective photoresist layers 25 provided thereon which are to be removed in accordance with the present invention by subjecting same to an ozone-containing gaseous atmosphere introduced into the reaction zone defined by the internal chamber 15 through the inlet 14. To promote photoresist removal in the presence of ozone, the substrates 24 are preferably heated to an elevated temperature by suitable heating means. To this end, the base 12 of the reactor 10 may be made of a refractory material in which an electrical resistance wire 26 is embedded. The electrical resistance wire 26 is connected to a suitable electrical power supply 27 so as to heat the substrate-supporting base member 12 upon being energized.

The reactor 10 of FIG. 1 requires manual loading and unloading of the substrates 24 from which the photoresist layers 25 are to be stripped. The base member 12 of the reactor 10 is heated to a temperature in the range of 150°–250° C. After the substrates 24 with their respective photoresist layers 25 have been placed on the substrate-supporting base member 12, the cover 11 of the reactor 10 is moved to the position shown in FIG. 1, the "closed" position. An ozone-containing gaseous atmosphere is then introduced to the chamber 15 through the inlet 14, being uniformly dispersed over the surfaces of the respective photoresist layers 25 of the substrates 24 by the perforated diffusion wall 16. As the ozone-containing gaseous atmosphere is being introduced to the chamber 15 via the inlet 14, a coolant fluid is being circulated through the jacket 17 surrounding the inlet 14 to maintain the ozone molecules at approximately ambient temperature just prior to the introduction of the ozone-containing gaseous atmosphere to the chamber 15. Upon entering the reaction zone, the ozone molecules contained in the gaseous atmosphere introduced via the inlet 14 attack the photoresist layers 25 causing oxidation thereof and removal as gaseous reaction products which are then exhausted with any excess ozone through the discharge outlet 22 in the cover 11 of the reactor 10. Thereafter, the exhaust products including any excess ozone are passed through a suitable ozone reduction treatment to decompose any excess ozone down to molecular oxygen. To this end, the ozone scrubber 23 is connected to the discharge outlet 22 for receiving the exhaust products from the chamber 15 and is effective to decompose any excess ozone. Other suitable means may be employed for this purpose, such as passing the exhaust products through a natural gas flame or through a heated catalytic material, such as copper oxide, for example.

Figure 2:
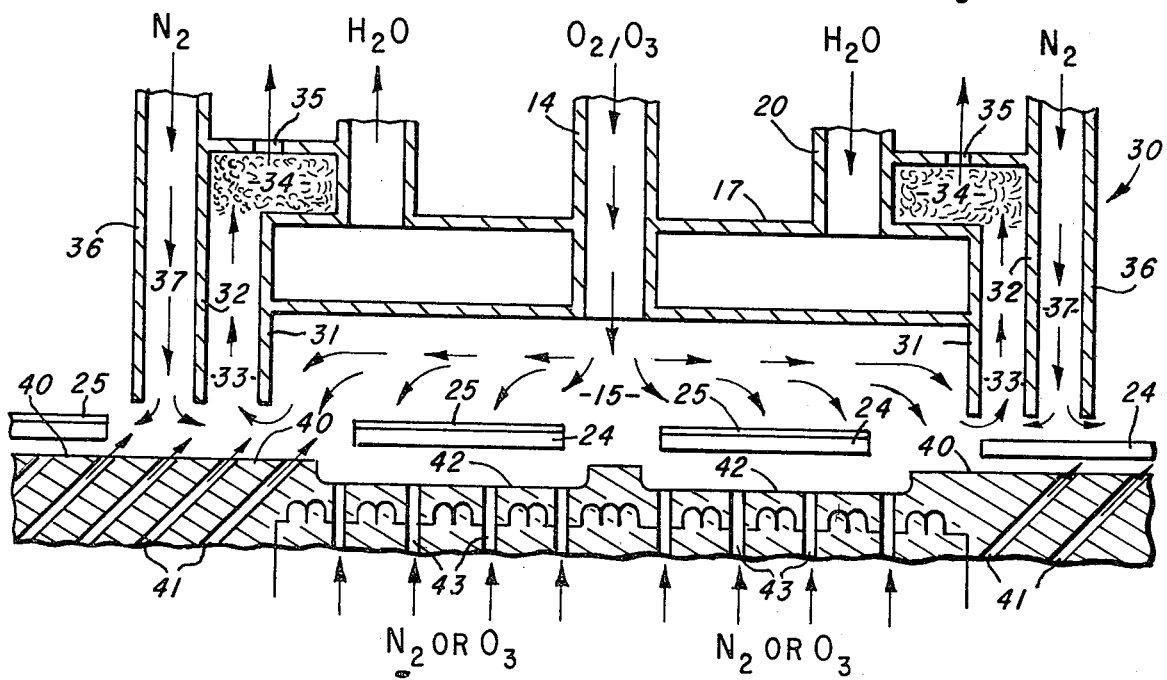
FIG. 2 is a sectional view, partially diagrammatic in character, of another embodiment of a reactor which may be employed in accordance with the present invention.

Another embodiment of a reactor apparatus suitable for performing the method of photoresist stripping or removal from substrates by ozone treatment is illustrated in FIG. 2. In this and subsequent embodiments of reactor apparatuses as illustrated in FIGS. 3a–3b, 4 and 5, it will be understood that like reference numerals have been applied to structural elements corresponding to the same structural elements as shown in the embodiment of FIG. 1. The reactor 30 of FIG. 2 principally differs from the reactor 10 of FIG. 1 in providing for the continuous serial feeding of semiconductor slices having layers of photoresist material thereon into the reaction zone of the reactor as defined by the chamber 15, thereby enabling the ozone stripping method herein disclosed to be practiced in an automated production line. To this end, the reactor 30 comprises a generally cylindrical housing 31 having a coolant jacket 17 formed in the upper portion thereof in encircling relationship to an inlet 14 communicating with the chamber 15. The coolant jacket 17 is provided with an inlet 20 and an outlet 21 for circulating a coolant fluid, such as water, about the inlet 14 in the same manner as the reactor 10 of FIG. 1.

The reactor 30 further comprises labyrinth seal arrangements respectively disposed at the entrance to and exit from the chamber 15, the entrance and exit labyrinth seal arrangements being of identical structure and comprising an intermediate cylindrical wall 32 disposed in radially outward spaced relation with respect to the housing 31 and defining therewith an annular exhaust passageway 33. The annular exhaust passageway 33 leads to an ozone reduction chamber 34 in communication therewith and disposed in juxtaposition with the coolant jacket 17. The ozone reduction chamber 34 is preferably filled with a catalytic material, such as silver shavings, for example, to facilitate decomposition of any excess ozone molecules present in the gaseous reaction products discharged from the chamber 15 through the exhaust passageway 33. Respective outlets 35 are provided for the ozone reduction chamber 34 for discharging reaction products from the reactor 30 after the excess ozone which may be present therein has been decomposed to molecular oxygen. The labyrinth seal arrangement further includes an outer cylindrical wall 36 arranged in radially outwardly spaced relationship to the intermediate wall 32 and defining therewith an annular passageway 37 disposed radially outwardly with respect to the exhaust passageway 33. The upper end of the annular passageway 37 communicates with a source of an inert gas, nitrogen and air being suitable for this purpose.

The reactor 30 is disposed over an air track 40 with the lowermost ends of the housing 31, the intermediate wall 32, and the outer wall 36 being spaced from the air track 40 to permit the passage of slices 24 into and out of the chamber 15 defining the reaction zone of the reactor 30. The air track 40 is provided with a plurality of ports 41 which are inclined in the direction of slice movement. The individual ports 41 communicate with a suitable source of air pressure so as to provide individual air jets therefrom in a direction moving the respective slices 24 from left to right as viewed in FIG. 2. In registration with the chamber 15 of the reactor 30, the air track 40 includes one or more air cushion holding stations 42, two such stations 42 being illustrated in FIG. 2. Each air cushion holding station 42 comprises a recessed area in the air track 40 having a dimension somewhat larger than an individual slice 24 to be processed and includes a plurality of gas ports 43 arranged substantially perpendicular to the surface thereof opposed to the slice 24. As will be understood, the individual ports 43 of the air cushion holding station 42 are connected to a suitable supply of compressed gas, which may be either nitrogen or ozone, ozone being employed when stripping of photoresist material from the under surface of the slice 24 is required in addition to the removal of the photoresist layer 25 from the upper surface of the slice 24. Means are provided for heating the air cushion holding stations 42, as for example an electrical resistance wire 26 embedded within the portion of the air track 40 in alignment with the chamber 15 as defined by the air cushion holding stations 42.

In operation, an inert gas, such as nitrogen or air, is supplied to the outer passageway 37 of the labyrinth seal arrangements at the entrance to and exit from the reaction zone of the reactor 30 as defined by the chamber 15. The inert gas within the passageway 37 is maintained at a positive pressure sufficiently in excess of the pressure of any gaseous reaction products to be exhausted from the chamber 15 so as to form a curtain of inert gas at the entrance to and exit from the chamber 15 of the reactor 30. Thus, any gaseous reaction products including excess ozone molecules upon being discharged from the chamber 15 are forced by the inert gas curtain to proceed along the exhaust passageway 33 to the ozone reduction chamber 34 prior to being discharged by the outlets 35 to the atmosphere.

Air jets emitted by the inclined ports 41 impart movement to the respective semiconductor slices 24. Each slice 24 moves along the air track 40 stopping inside the chamber 15 of the reactor 30 in the first air cushion holding station 42, remaining there for a predetermined period as an ozone-containing gaseous atmosphere is being introduced to the chamber 15 by the inlet 14. The slice 24 is then moved to the second holding station 42 for a like time period, such as thirty seconds for example, and then caused to exit from the chamber 15 along the air track 40 after the layer of photoresist material 25 has been stripped therefrom. At both ends of the chamber 15, gaseous reaction products and excess ozone are discharged into the exhaust passageway 33 being confined to a flow path extending through the exhaust passageway 33 by the positive pressure inert gas curtain flowing downwardly through the passageway 37 and outwardly in opposite directions from the lower end thereof to prevent escape of the gaseous reaction products and excess ozone from the chamber 15 to the atmosphere. In addition, the labyrinth seal arrangement provided by the curtain of inert gas in the passageway 37 seals off the chamber 15 from foreign matter, such as dust particles, in the ambient atmosphere.

Each of the air cushion holding stations 42 is constructed so as to cause a slice 24 to float in place on an air cushion as provided by the perpendicular ports 43. Since the air track 40 is heated by the electrical resistance wire 26, the slice becomes heated and the removal of the photoresist material therefrom by the ozone present in the gaseous atmosphere within the chamber 15 takes place. Alternatively, the holding stations 42 could be provided simply by turning off the air emitted through the respective ports of the air track 40 when the slice 24 reaches a particular location within the chamber 15. In this mode, the movement of the slice 24 along the air track 40 would stop, such that the slice 24 rests directly on the heated air track 40 in subjecting a photoresist layer 25 thereon to an ozone stripping treatment.

Figure 3A:
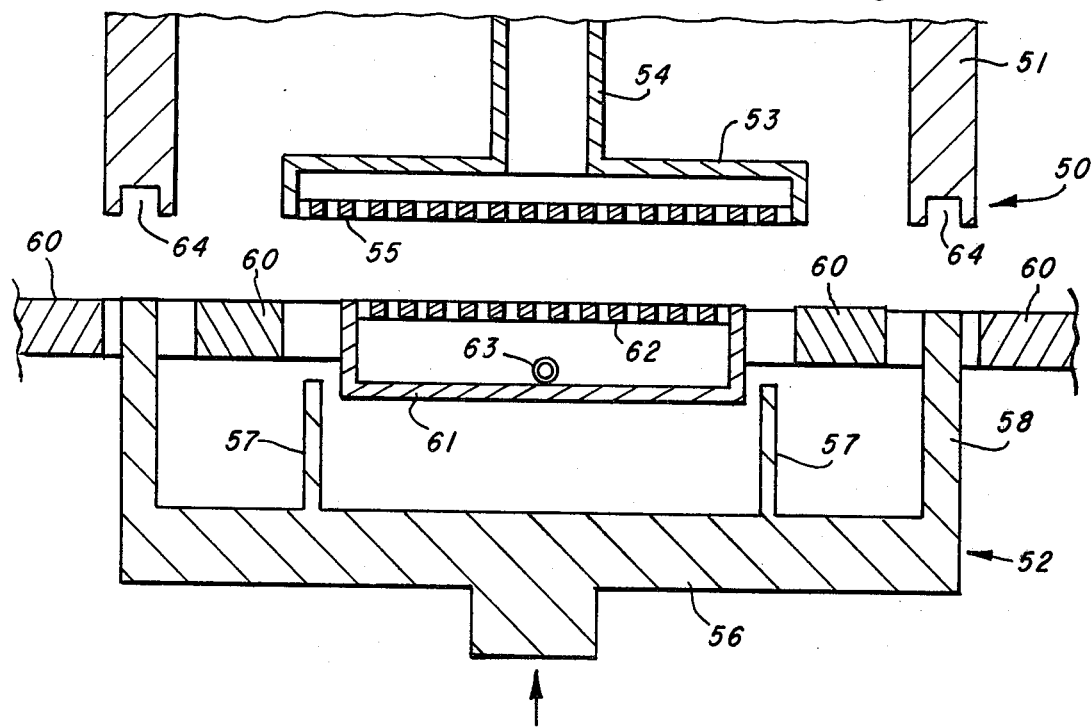
FIG. 3a is a sectional view of another embodiment of a reactor in accordance with the present invention, wherein the reactor is depicted in an open condition.
Figure 3B:
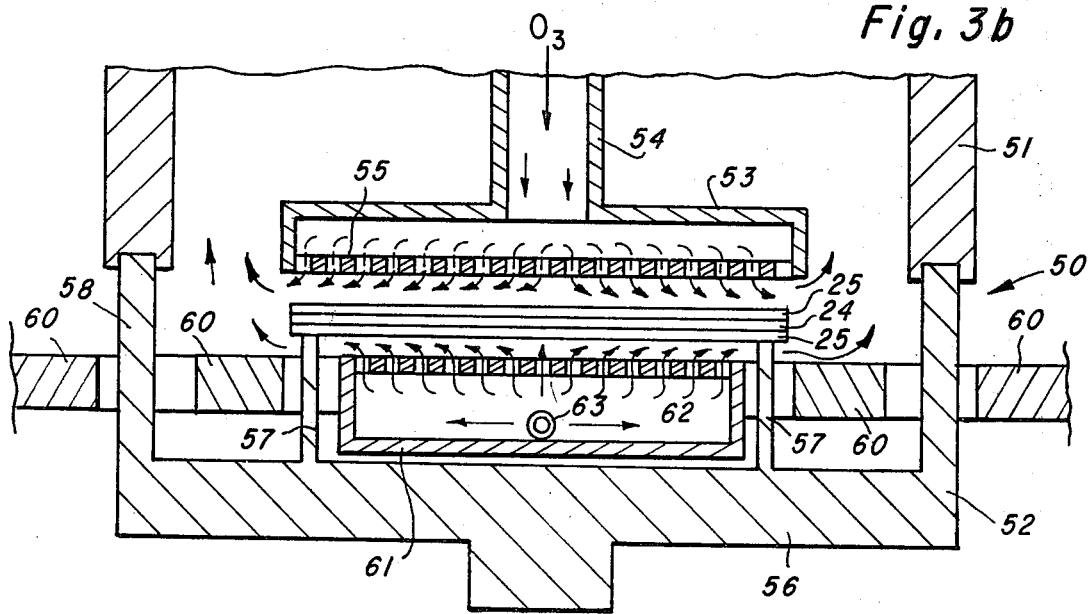
FIG. 3b is a sectional view showing the reactor of FIG. 3a as it appears in a closed condition.

FIGS. 3a and 3b illustrate another embodiment of a reactor apparatus suitable for practicing the method of removing photoresist material from a substrate by subjecting same to an ozone-containing gaseous atmosphere. The reactor 50 of the FIGS. 3a and 3b is segmental in character comprising upper and lower housing portions 51,52 which are relatively movable with respect to each other between open and closed positions, FIG. 3a illustrating the open position and FIG. 3b illustrating the closed position of the reactor 50. The upper housing portion 51 has a reaction-confining cup 53 mounted therein in inverted position, the cup 53 being provided with an inlet 54 centrally located thereon and extending upwardly into communication with a source of an ozone-containing gaseous atmosphere. The cup 53 is further provided with a perforated gas diffusion plate 55 disposed across the mouth thereof.

The lower housing portion 52 is mounted for movement along an axial direction into and out of engagement with the upper housing portion 51 of the reactor 50. In this respect, the lower housing portion 52 may be connected to a suitable power source for imparting such movement thereto. For example, the lower housing portion 52 may act as a piston under the influence of gaseous pressure applied to the base 56 thereof. The lower housing portion 52 further includes substrate-supporting means in the form of a plurality of pins 57 and a peripheral flange 58, the pins 57 and the flange 58 being integral with the base 56 and extending upwardly therefrom.

A substrate feed track 60 extends lengthwise through the reactor 50, the track 60 being provided with suitable apertures for receiving the endless flange 58 forming the outer periphery of the lower housing portion 52 and the plurality of substrate-supporting pins 57. In this connection, it will be observed that the endless flange 58 of the lower housing portion 52 is substantially flush with the track 60, while the substrate-supporting pins 57 are disposed beneath the track 60 in the open position of the reactor 50 as shown in FIG. 3a. The track 60 further includes a substrate holding station 61 which is positioned radially inwardly with respect to the substrate supporting pins 57 and in alignment with the inverted cup 53 mounted in the upper housing portion 51. The substrate holding station 61 is of cup-like configuration and includes a perforated gas diffusion plate 62 across the mouth thereof and an inlet port 63 for introducing either an inert gas or an ozone-containing gaseous atmosphere into the cup-like member 61.

The track 60 may be provided with a suitable motive means for advancing substrates 24 continuously therealong in serial fashion. Alternatively, the reactor 50 may be operated by manual loading and unloading of a substrate 24 having a photoresist layer 25 thereon to be stripped therefrom. In either case, once the substrate 24 is positioned astride the cup member 61, a control mechanism is operated to impart relative movement between the upper and lower housing portions 51,52 to close the reactor 50, thereby assuming the position illustrated in FIG. 3b. A suitable sealing means is provided between the upper and lower housing portions 51, 52 to define a closed fluid-tight internal chamber, with a reaction zone being defined between the inverted cup 53 mounted in the upper housing portion 51 and the cup 61 defining an intermediate portion of the track 60. In this connection, the upper housing portion 51 may be provided with an endless channel or groove 64 for receiving the end of the flange 58 of the lower housing portion 52 in sealing relationship. Coincidentally with the movement of the lower housing portion 52 into sealing engagement with the upper housing portion 51, the substrate-supporting pins 57 of the lower housing portion 52 are moved upwardly so as to extend above the level of the upper surface of the track 60 to suspend the substrate 24 thereon in spaced relation to the perforated gas diffusion plate 62 extending across the mouth of the cup 61. In this manner, an ozone-containing gaseous atmosphere may be introduced into the cup 61 through the port 63 for removal of a photoresist layer 25 on the lower surface of the substrate 24 at the same time that an ozone-containing atmosphere is introduced into the inverted cup 53 through the inlet 54 for removal of the photoresist layer 25 on the upper surface of the substrate 24.

Figure 4:
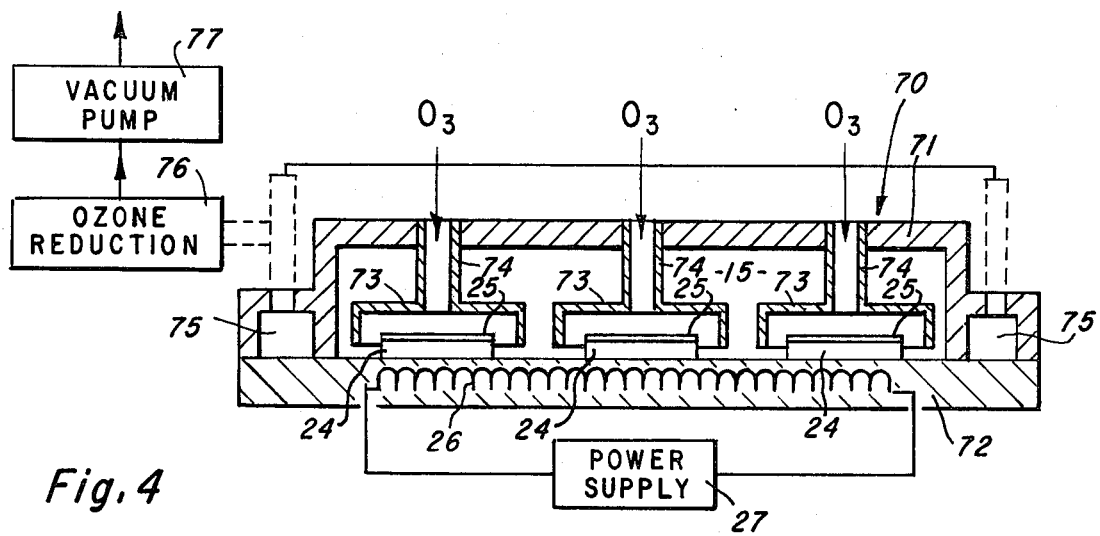
FIG. 4 is a sectional view, partially diagrammatic in character, of another embodiment of a reactor for removing photoresist material from a substrate in accordance with the present invention.

FIG. 4 illustrates yet another embodiment of a reactor apparatus 70 suitable for performing the method of removing a photoresist layer from a substrate by an ozone treatment. The reactor 70 of FIG. 4 is a batch-type apparatus as is the case with respect to the reactor 10 of FIG. 1 in that individual substrates 24 with photoresist layer 25 thereon must be manually loaded and unloaded into the housing 71 of the reactor 70. The substrates 24 are placed on a base member 72 which cooperates with the housing 71 to define an internal chamber 15. The housing 71 is removably mounted on the base member 72 in a suitable manner for loading and unloading of the substrates 24. A plurality of inverted confining cup members 73 are mounted in the housing 71 so as to depend from the top wall thereof by respective inlet passages 74. The inverted cup members 73 are so disposed as to overlie respective substrates 24 having photoresist layers 25 to be removed. An ozone-containing gaseous atmosphere is introduced through each of the inlets 74 for the individual inverted cup members 73 so as to subject the photoresist layers 25 on the substrates 24 to the presence of ozone molecules substantially immediately following introduction of the ozone-containing gaseous atmosphere within the respective inverted confining cups 73. Like the reactor 10 of FIG. 1, the base member 72 is of refractive material and includes an electrical resistance wire 26 embedded therein extending across the longitudinal dimension of the internal chamber 15 so as to heat the individual substrates 24 following the positioning of the substrates 24 within the inverted cup members 73 and in registration with the respective inlets 74 thereon. An endless vacuum chamber 75 is provided so as to be located in surrounding relation to the reaction chamber 15, the vacuum chamber 75 being in communication with an ozone reduction chamber 76 and a vacuum pump 77.

It will be understood that the gaseous reaction products resulting from the exposure of the photoresist layers 25 on the substrates 24 to the individual streams of the ozone-containing gaseous atmosphere are exhausted through the vacuum chamber 75 surrounding the chamber 15 by the vacuum induced therein from the vacuum pump 77. These gaseous reaction products including any excess ozone molecules are first directed through the ozone reduction chamber 76 to decompose excess ozone to molecular oxygen. Thus, the vacuum chamber 75 serves as a seal between the housing 71 and the base member 72 of the reactor 70 when the vacuum pump 77 is operating.

Figure 5:
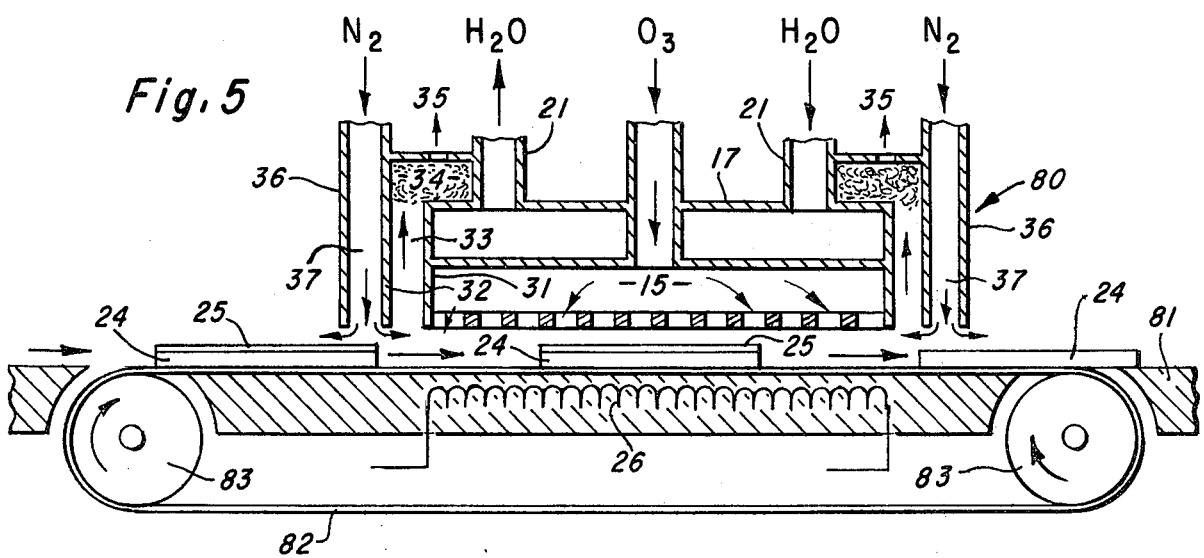
FIG. 5 is a sectional view, partially diagrammatic in character, of yet another embodiment of a reactor employed in removing a layer of photoresist material from a substrate in accordance with the present invention.

Yet another embodiment of an apparatus reactor suitable for practicing the method of photoresist removal by ozone treatment is depicted in FIG. 5, wherein the reactor 80 is similar to the reactor 30 of FIG. 2 except for the means of feeding substrates 24 into and out of the chamber 15 defining the reaction zone of the reactor 80. In FIG. 5, a heated track 81 is provided in place of the air track 40 for the reactor 30 of FIG. 2, and a slice conveyor in the form of a pair of endless parallel wires 82 entrained about motor-driven wheels 83 is mounted on the heated track 81. It will be understood that substrates 24 are respectively supported on the parallel wires 82 which convey the substrates 24 in serial fashion into and out of the chamber 15 of the reactor 80 upon imparting rotation to the wheels 83 from a motor (not shown).

Figures 9A, 9B, 9C:
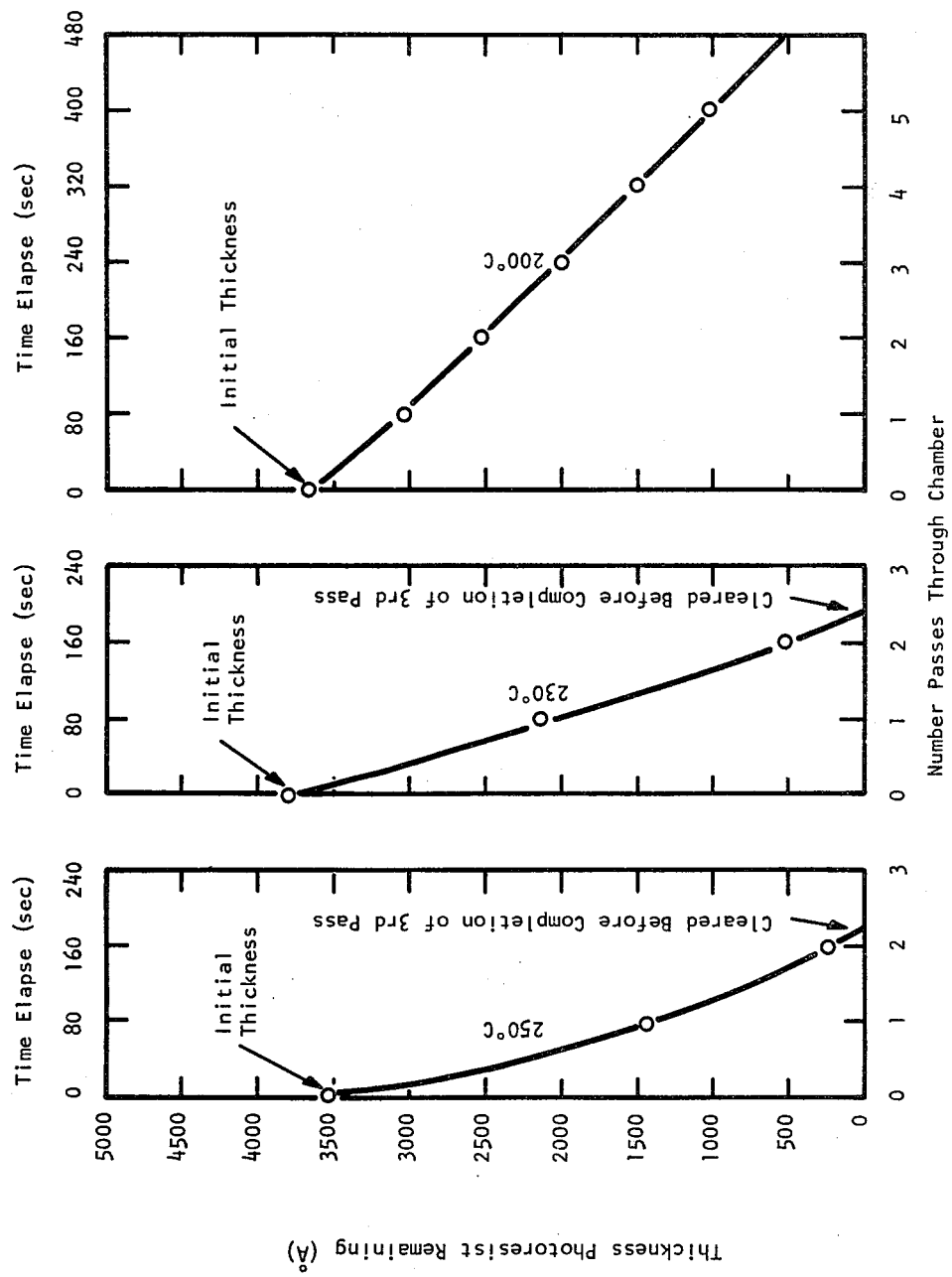
FIGS. 9a–9c are graphs showing the removal rate of a positive photoresist material from a substrate by ozone for various temperatures to which the photoresist layer is heated.

Referring now more particularly to the ozone treatment method for removing photoresist layers from substrates, it has been determined that the two primary parameters affecting photoresist removal rates are temperature and ozone concentration. Various photoresists behave differently to ozone and their removal rates vary widely, primarily due to differences in photoresist chemistry and the resulting ease of difficulty with which oxidation thereof occurs. Another complicating factor affecting photoresist removal rate is the processing history of the photoresist layer itself. In this connection, extended baking cycles or plasma discharges in the vicinity of a photoresist layer prior to its removal tend to enhance cross-linking of the organic polymer material thereof, thereby increasing the resistance of the photoresist to removal upon being subjected to ozone. As illustrated more particularly in the graphs of FIGS. 9a–9c and FIGS. 11a–11c, the rate of removal of photoresist material by an ozone treatment is directly related to temperature. Thus, FIGS. 9a–9c respectively show a decreasing removal rate for Shipley A-Z 1350 positive photoresist material, where the substrates on which the photoresist material was disposed were maintained at progressively decreasing temperatures, 250° C. in FIG. 9a, 230° C. in FIG. 9b, and 200° C. in FIG. 9c. The decreasing rate of photoresist removal for decreasing temperatures of the substrate is readily apparent. A similar relationship is shown by the graphs of FIGS. 11a–11c, where Waycoat negative photoresist was removed from respective substrated heated to progressively higher temperatures, 180° C. in FIG. 11a, 200° C. in FIG. 11b, and 250° C. in FIG. 11c. Again, the rate of photoresist removal increased as the temperature of the substrate was increased. FIG. 10 shows a graph for a positive photoresist GAF PR-301 on a substrate maintained at a temperature of 250° C. showing removal of the positive photoresist material from the substrate by ozone treatment in like manner to the results shown with respect to the photoresist materials of FIGS. 9a–9c and 11a–11c.

Heating of the substrate should be accomplished rapidly to avoid baking the photoresist layer over an appreciable time intrerval which leads to undesirable cross-linking of the organic polymer material tending to hinder its removal by ozone treatment. The removal rate of photoresist material by ozone treatment in accordance with this invention is not constant, the removal rate decreasing with time. The manner in which the removal rate decreases is also affected by the particular photoresist material and the temperature. At lower temperatures, the removal rate of photoresist by ozone treatment tends to approach a more linear function. In each of the graphs shown in FIGS. 9a–9c, 10, and 11a–11c, the photoresist removal rate was determined in terms of photoresist thickness remaining after respective passes through an ozone reaction chamber of eight inches in length, wherein the translation speed of the substrate is 0.1 inches/second or 80 seconds for each complete pass through the reaction chamber. The ozone concentration was maintained at 72 milligrams $O_3$ per liter of gaseous atmosphere within the reaction chamber for the photoresist materials providing the data represented by the graphs of FIGS. 9a–9c and 11a–11c. In the testing applied to the positive photoresist, the data for which comprises the graph of FIG. 10, the ozone concentration was maintained at 62.5 milligrams $O_3$ per liter of gaseous atmosphere, with the translation speed of the substrate being at the same 80 seconds per complete pass through the reaction chamber.

In order to perform the method of ozone treatment in the most efficient manner, the slice containing the photoresist layer to be removed must be maintained at an elevated temperature, while the ozone molecules in the ozone-containing gaseous atmosphere should be maintained at an ambient temperature (unheated) until the ozone-containing gaseous atmosphere is directed onto the photoresist layer of the slice. If the ozone molecules are permitted to become heated before contacting the photoresist layer on the slice, the heat will tend to decompose the ozone molecules thereby lowering the ozone concentration to less efficient levels for photoresist removal. Therefore, the reactors illustrated in FIGS. 1–5 have been constructed in a manner to either cool the ozone-containing gaseous atmosphere immediately prior to its introduction into the reaction zone or to so configure the reactor as to immediately direct the ozone-containing gaseous atmosphere onto the photoresist layer to be removed over a minimal time interval to avoid heating of the ozone molecules to the extent possible. In general, the optimum range for photoresist removal by ozone treatment in accordance with this invention involves heating the substrates to a temperature in the range of 200°–250° C. When the temperature of the substrate is maintained below 200° C., the photoresist removal rate tends to be too slow, and a like characteristic appears above approximately 260° C. where the removal rate of the photoresist material again begins to slow down. In this latter instance, it is theorized that at temperatures above 260° C., the ozone molecules tend to be decomposed by the heat from the "hot plate" surface offered by the photoresist layer on the substrate before the ozone actually contacts the photoresist material.

Figure 12:
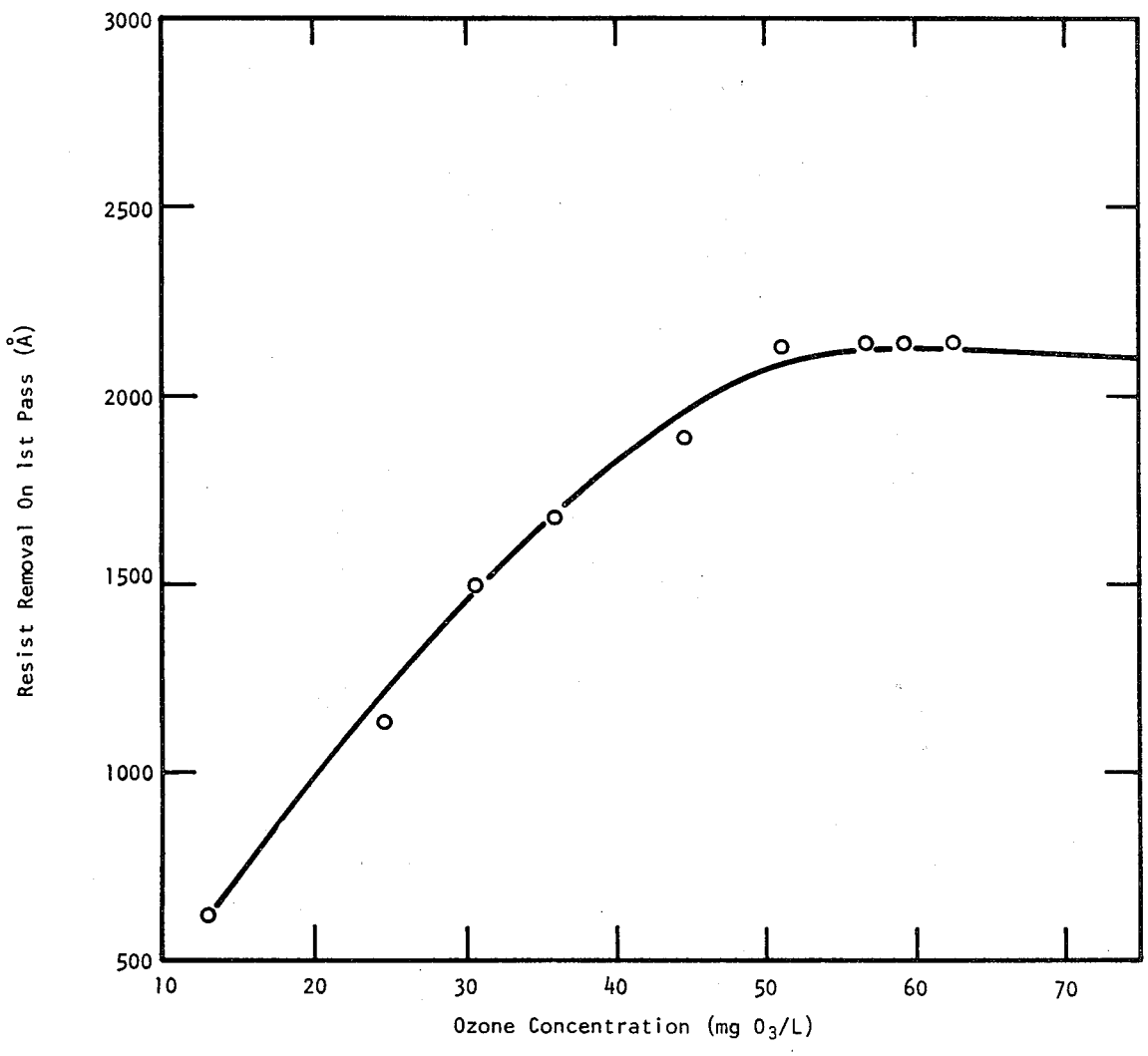
FIG. 12 is a graph illustrating the relationship between photoresist removal of a positive photoresist material and ozone concentration.
Figure 13:
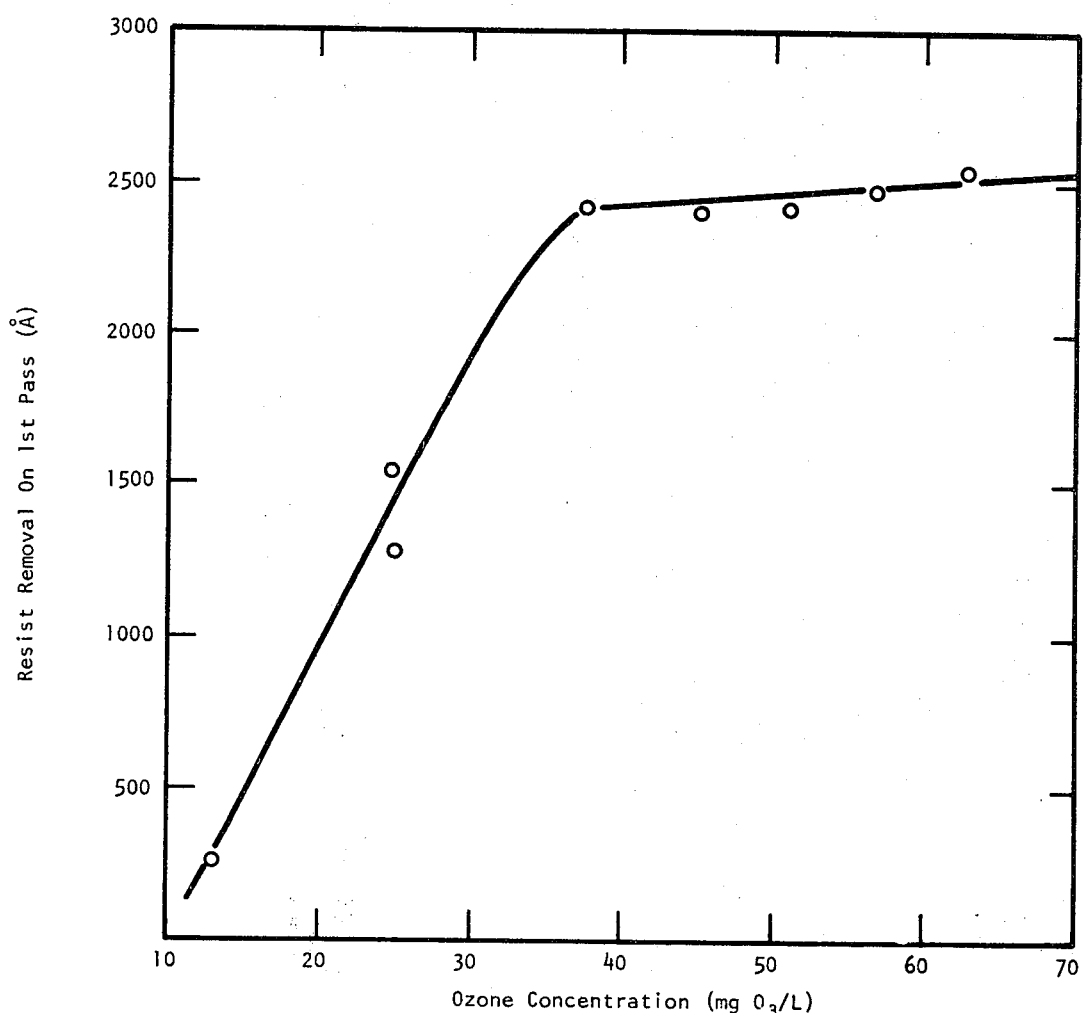
FIG. 13 is a graph similar to FIG. 12, but showing the relationship between photoresist removal and ozone concentration for a different positive photoresist material.
Figure 14:
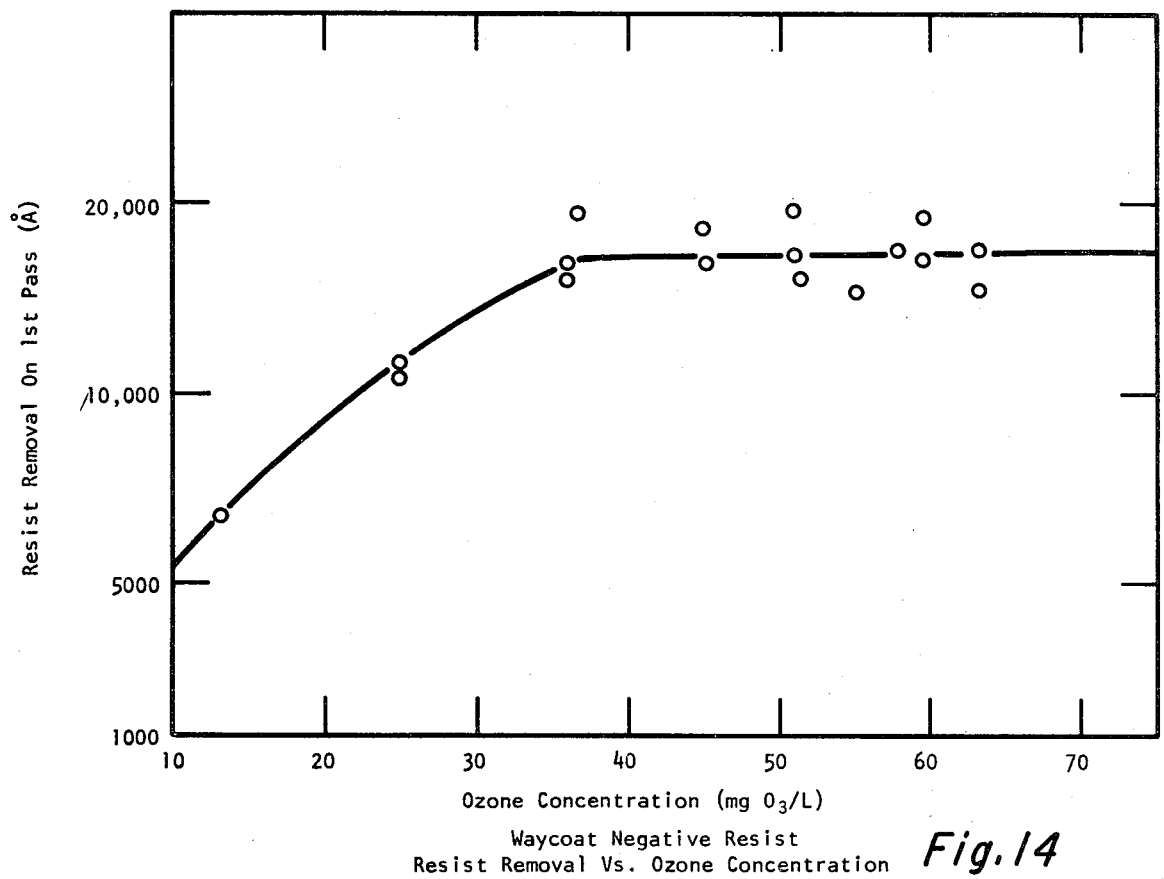
FIG. 14 is a graph similar to FIGS. 12 and 13, but showing the relationship between photoresist removal and ozone concentration for a negative photoresist material.

Ozone concentration is the second important parameter affecting photoresist removal rate. In this respect, the photoresist removal rate increases as the ozone concentration increases up to a point where the reaction between the photoresist material and the ozone molecules is no longer concentration-limited. This point occurs at different ozone concentrations depending on the particular photoresist material. Illustrative of this relationship are the graphs shown in FIGS. 12, 13 and 14 which respectively plot photoresist removal versus ozone concentration for three different photoresist materials. FIG. 12 illustrates data obtained from the removal of Shipley A-Z 1350 positive photoresist where the substrate translation speed was 0.1 inches/second, the substrate temperature was maintained at 250° C., and the flow rate of the ozone-containing atmosphere was maintained at 4 liters/minute. FIG. 13 illustrates data obtained from the removal of GAF PR-301 positive photoresist where the substrate translation speed was 0.1 inches/second, the substrate temperature was maintained at 250° C., and the flow rate of the ozone-containing atmosphere was maintained at 4 liters/minute. FIG. 14 illustrates data obtained from the removal of Waycoat negative photoresist where the substrate translation speed was 0.3 inches/second, the substrate temperature was maintained at 240° C., and the flow rate of the ozone-containing atmosphere was maintained at 4 liters/minute. The graphs of FIGS. 12, 13 and 14 demonstrate an increasing photoresist removal rate as the ozone concentration increases until a concentration-limiting point is reached where further increases in ozone concentration have no further effect in the photoresist removal rate. As shown in FIGS. 12, 13 and 14, the photoresist removal rate saturation point is not always at the same ozone concentration for different photoresist materials. This variance enables one to make a more efficient match of the ozone/flow rate output characteristics of a particular ozone generator with a specific photoresist material.

Figure 15:
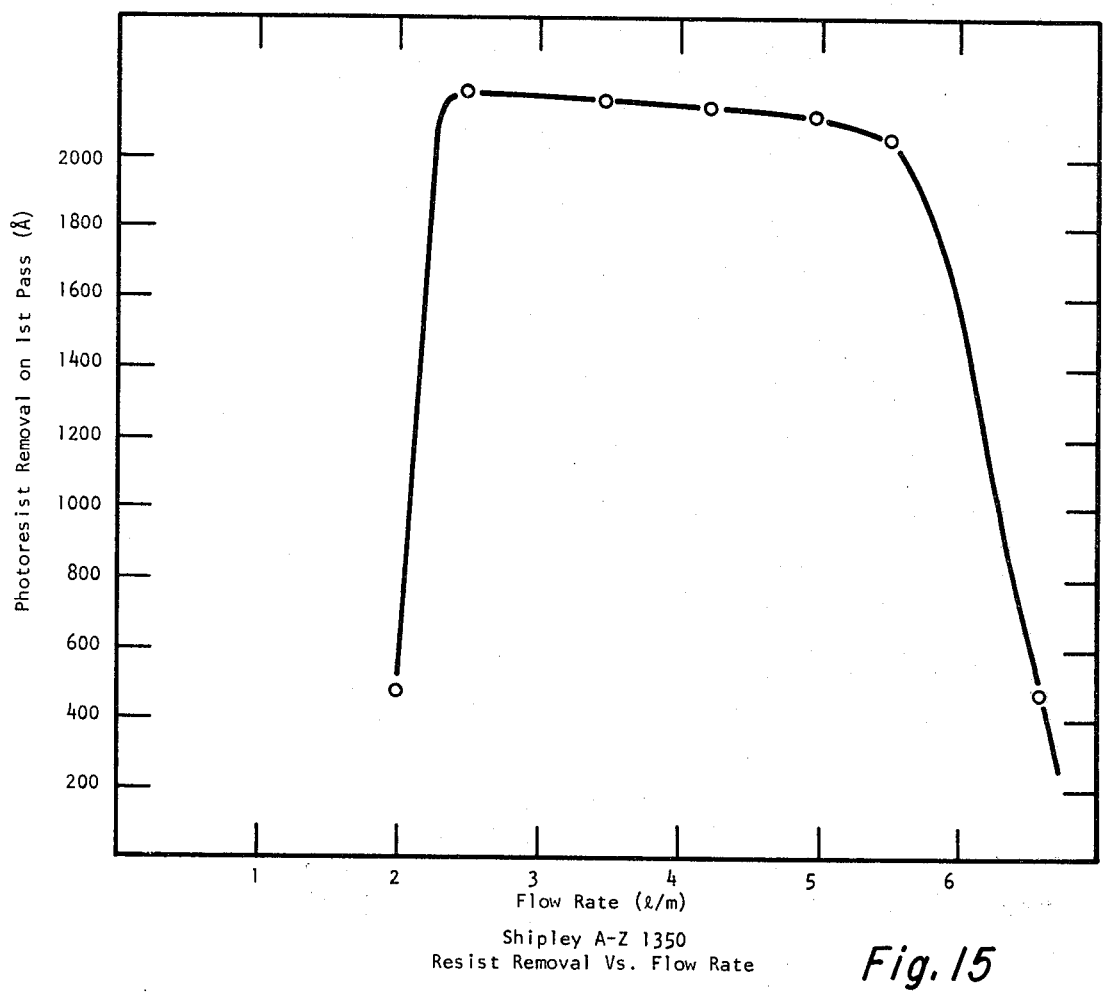
FIG. 15 is a graph showing the relationship between photoresist removal and ozone flow rate thereacross for a positive photoresist material.
Figure 16:
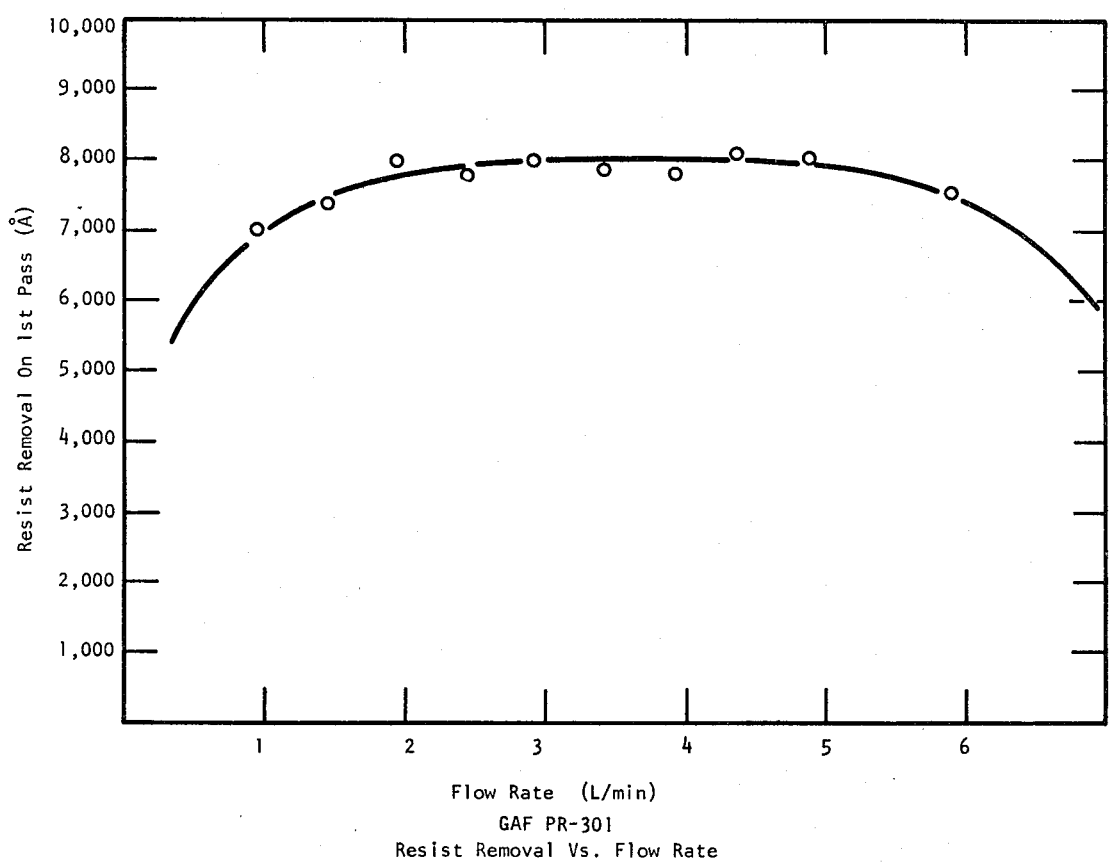
FIG. 16 is a graph similar to FIG. 15, but showing the relationship between photoresist removal and ozone flow rate thereacross for a different positive photoresist material.
Figure 17:
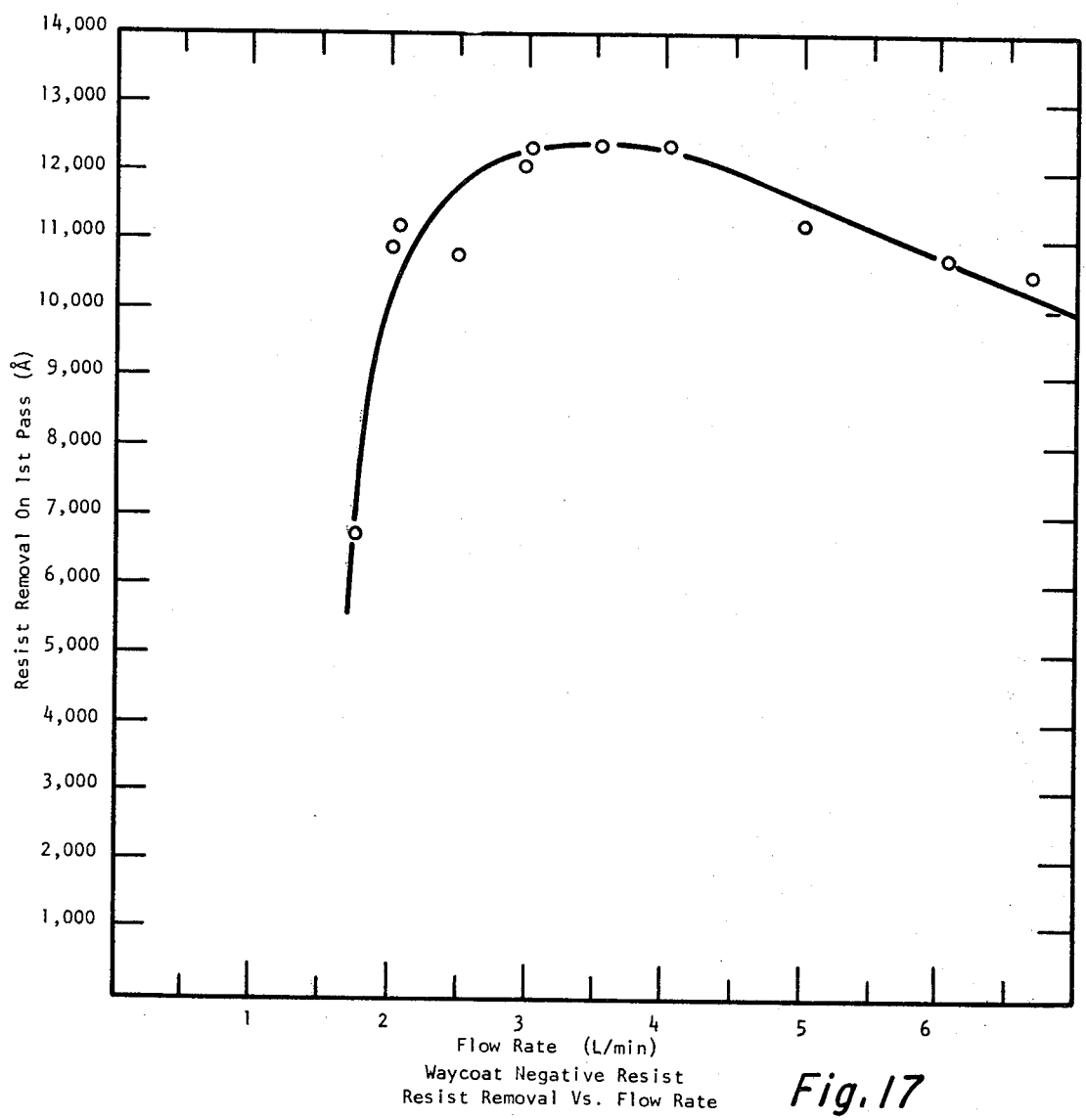
FIG. 17 is a graph similar to FIGS. 15 and 16, but showing the relationship between photoresist removal and ozone flow rate thereacross for a negative photoresist material.

Another parameter affecting the reaction which controls photoresist removal rate by ozone treatment is the flow rate of the ozone-containing gaseous atmosphere. This flow rate controls the photoresist removal reaction in an indirect manner tending to increase the reaction rate as the flow rate is increased because more ozone molecules are available at the surface of the photoresist layer. However, when the flow rate of the ozone-containing gaseous atmosphere is sufficiently elevated to a high value, it tends to lower the surface temperature of the photoresist material on the slice causing the photoresist removal reaction rate to decrease. At very low flow rates, the ozone-photoresist reaction is concentration limited due to thermal degradation of the ozone and its more limited availability to the surface of the photoresist material. As the flow rate is increased, the photoresist removal rate also increases until it is no longer concentration limited and then is relatively constant. A further increase in the flow rate beyond this point causes the photoresist removal rate to decline as the velocity of the ozone-containing gas stream begins to cool down the surface of the photoresist material on the slice. Since the reaction rate governing photoresist removal is a strong function of temperature, the photoresist removal rate declines rapidly. The graphs shown in FIGS. 15, 16 and 17 illustrate this relationship for Shipley A-Z 1350 positive photoresist, GAF PR-301 positive photoresist, and Waycoat negative photoresist, respectively. In each of the graphs of FIGS. 15, 16 and 17, the substrate was maintained at a temperature of 250° C. The translation speed of the substrate through the reaction chamber was 0.1 inch per second for the data represented in FIGS. 15 and 16 and was 0.32 inches per second for the data represented in FIG. 17.

Figure 18:
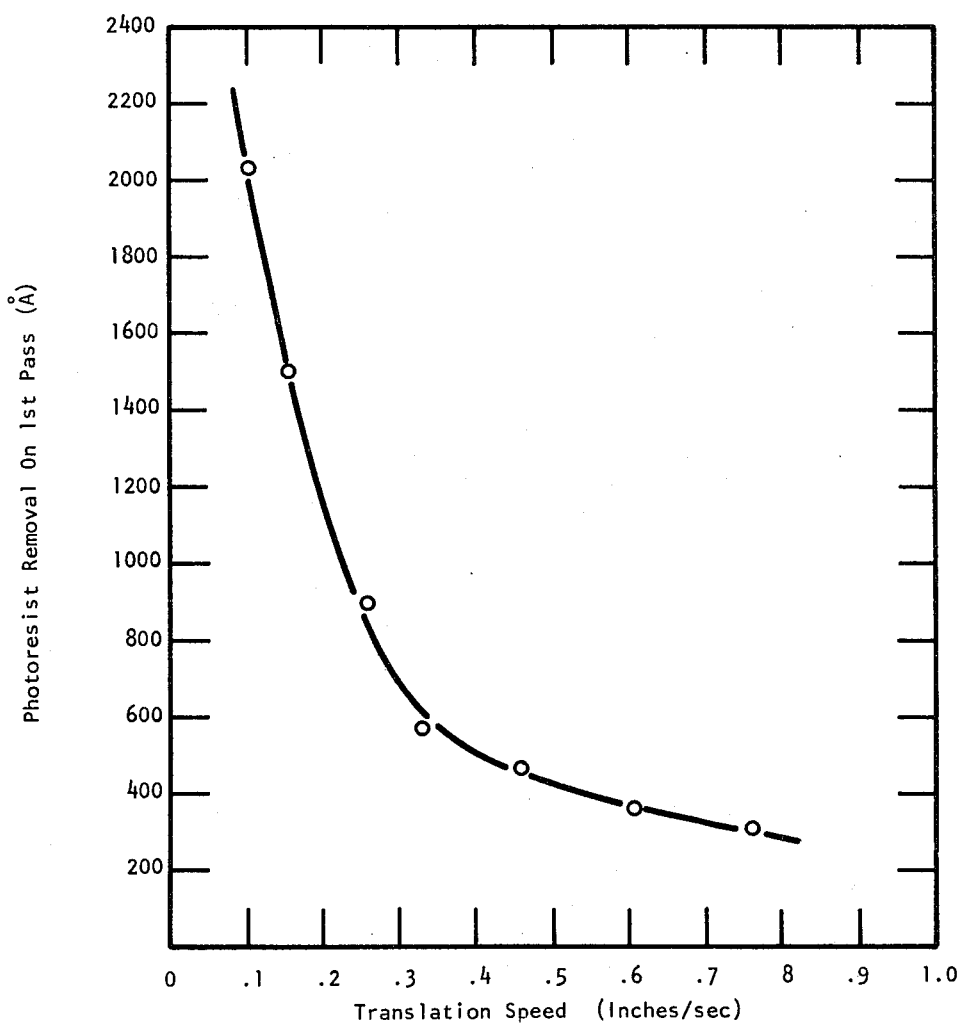
FIG. 18 is a graph showing the relationship between photoresist removal and translation speed of the substrate having the photoresist layer thereon through the reaction zone of the reactor, where a positive photoresist material is involved.
Figure 19:
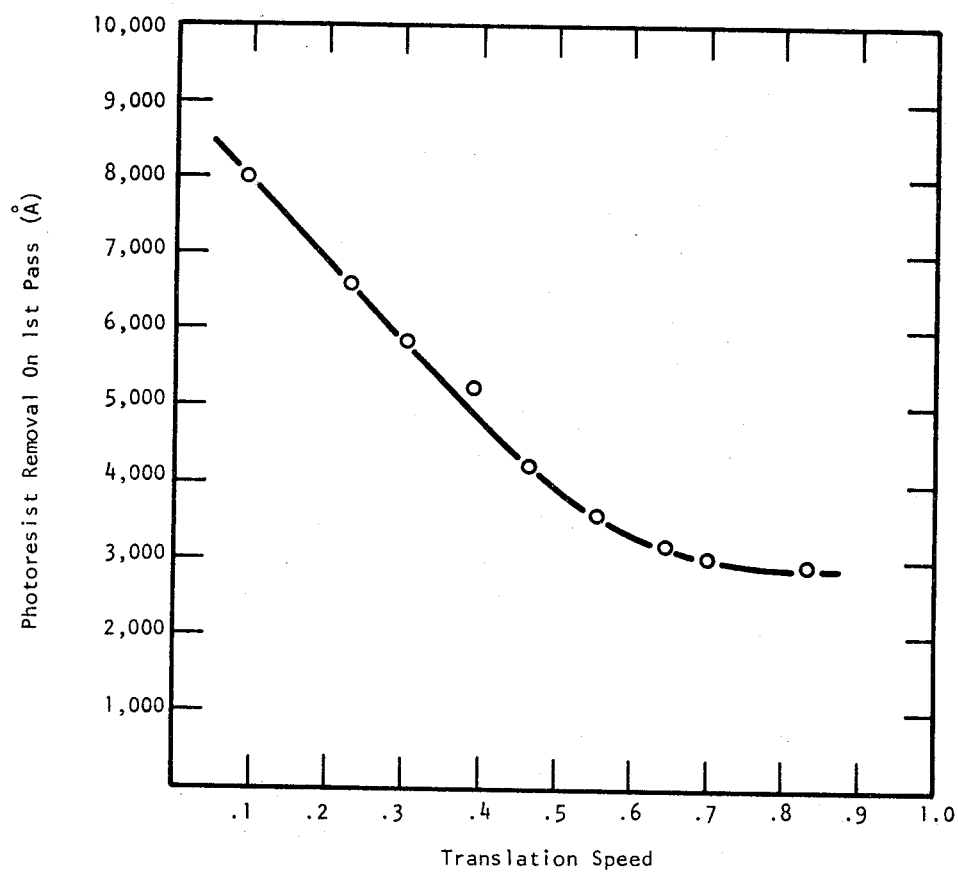
FIG. 19 is a graph similar to FIG. 18, but showing the relationship between photoresist removal and substrate translation speed for a different positive photoresist material.
Figure 20:
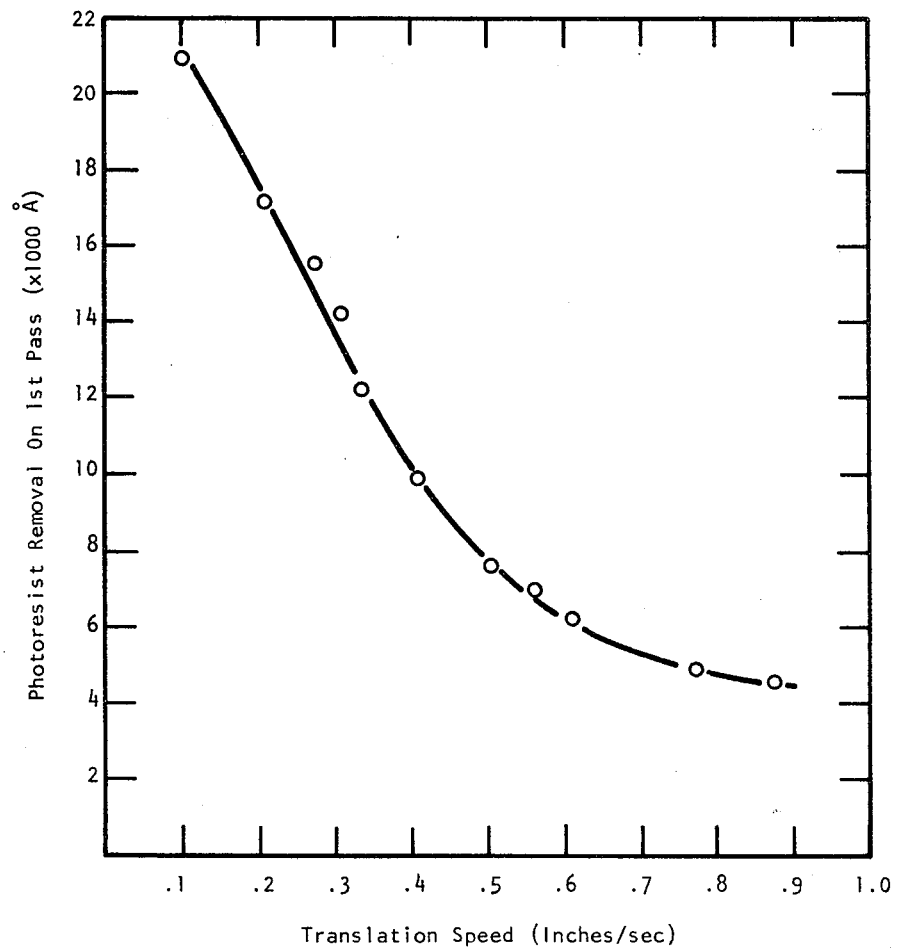
FIG. 20 is a graph similar to FIGS. 18 and 19, but showing the relationship between photoresist removal and substrate translation speed for a negative photoresist material.

The graphs shown in FIGS. 18, 19 and 20 illustrate the relationship between photoresist removal and translation speed of the substrate through the reaction zone for Shipley A-Z 1350 positive photoresist, GAF PR-301 positive photoresist and Waycoat negative photoresist material, respectively. In each instance, the substrate was maintained at a temperature of 250° C. and the ozone concentration was maintained at 72 milligrams/liter. The curves depicted in the graphs of FIGS. 18, 19 and 20 demonstrate that the photoresist removal rate is non-linear as a function of time as previously discussed.

The extent of inorganic residue left on a substrate after stripping of a photoresist layer therefrom by an ozone treatment in accordance with this invention has been determined, applying as a basis of comparison a criterion adopted for metal oxide semiconductor slices as determined by a standard 300° C. stress test routine. In this respect, any inorganic contamination present in a photoresist material remains on the substrate after stripping of the photoresist material, either by an ozone treatment in accordance with the present method or by standard practices employed in photoresist stripping, such as for example, employing wet solvent chemical reagents. In a metal oxide semiconductor chip, such contamination on a non-phosphorus stabilized gate is unacceptable. Rinsing of the unstabilized gate in hot de-ionized water after an ozone treatment has removed a photoresist layer from the metal oxide semiconductor chip reduces such contamination to a level comparable to the conventional clean-up procedure involving the "Piranha" photoresist removal technique and standard MOS gate clean-up sequence. The so-called "Piranha" photoresist removal technique involves subjecting the semiconductor slice to a solution of sulfuric acid and hydrogen peroxide existing in an approximate 2:1 ratio for a period of 1½–2 hours, followed by a clean-up treatment requiring the use of nitric acid in an aqueous solution to remove contamination remaining on the MOS semiconductor chip. In this context, the superiority of the ozone treatment as a means of photoresist removal is demonstrated in that rinsing of the unstabilized MOS gate in hot de-ionized water is adequate to reduce any residual contamination present after ozone stripping of the photoresist material to a comparable level achieved by the conventional "Piranha" and MOS gate clean-up procedure as identified herein.

A further aspect of the ozone treatment technique herein disclosed for the removal of photoresist material from a substrate involves an ozone treatment after the use of a conventional wet development technique has been employed to develop a photoresist image. In this connection, the definition of a developed photoresist image by conventional wet development procedures was substantially enhanced by exposing the developed photoresist image to a gaseous atmosphere of oxygen containing from 0.25–1% ozone for a time interval of 5–30 seconds at temperatures ranging from 100° C. to 140° C. The residual scum in the windows, i.e., areas where the photoresist is removed by development, was removed and/or converted to a water soluble compound which dissolved into a subsequent acid etch employed to pattern the layer beneath the developed photoresist layer. This "flash" ozone treatment resulted in smoothing the edges of the developed photoresist pattern such that the resulting etched pattern had straighter edges.

A more specific application of this de-scumming technique employing ozone has been accomplished when the layer immediately beneath the photoresist layer is aluminum to be etched in a TIL etchant solution (phosphoric, nitric, ascetic acid system), where there is a tendency for hydrogen bubbles generated by the etching reaction on the aluminum layer to cling to the slice. This problem is graphically depicted in FIGS. 6a–6c, wherein a semiconductor substrate 90 is provided with an aluminum layer 91 thereon having portions thereof covered by a patterned photoresist layer 92. In developing the photoresist layer 92 by conventional wet development procedures, residual deposits of photoresist material 93 commonly occur at random locations in the opened-up areas of the photoresist layer 92 and along the edge of the photoresist pattern tapering down to the surface of the aluminum layer 91. As the aluminum layer 91 is being etched by the application of a TIL etchant mixture, hydrogen bubbles 94 tend to cling to the surface of the aluminum layer 91, becoming enlarged in the process as shown in FIG. 6c, so as to prevent fresh etchant acid from contacting the surface of the aluminum layer 91 therebeneath. These hydrogen bubbles 94 tend to concentrate in areas including residue 93 from the patterned photoresist layer 92, as shown in FIG. 6c. Upon completion of the etching stage under such conditions, undesirable portions of aluminum 95 including islands thereof remain on the substrate 90 due to the presence of the photoresist residue 93 and the tendency of the hydrogen bubbles 94 to form therearound. The resultant semiconductor slice is shown in FIG. 7 and is unacceptable for use.

Figure 6A:
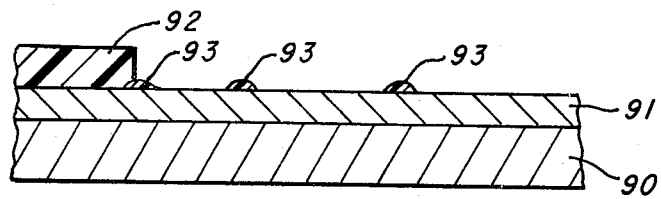
FIG. 6a is a longitudinal sectional view of a substrate having layers of aluminum and photoresist material disposed thereon wherein the aluminum layer is to be patterned by an etchant acid as determined by the photoresist layer.
Figure 6B:
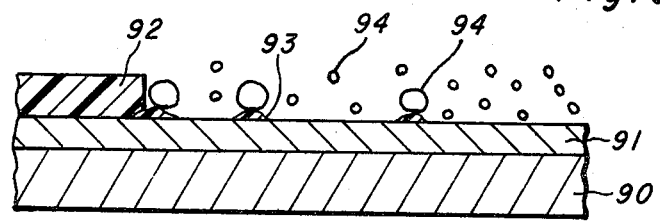
FIG. 6b is a sectional view similar to FIG. 6a and showing the formation of hydrogen bubbles as generated by the reaction between the aluminum layer and the etchant acid.
Figure 6C:
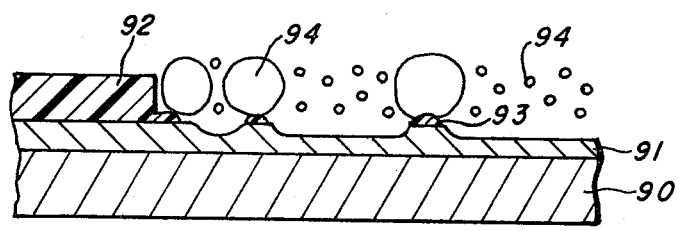
FIG. 6c is a sectional view showing a further stage in the technique depicted in FIGS. 6a and 6b.
Figure 7:
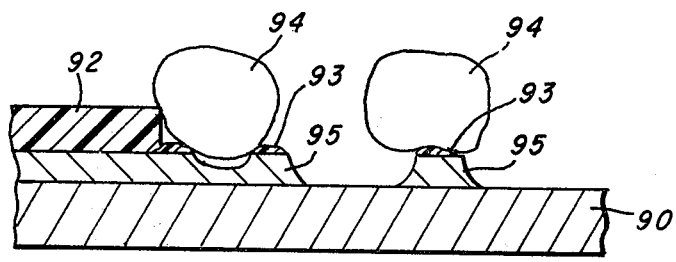
FIG. 7 is a sectional view illustrating the retention of aluminum islands under residual photoresist material, after completion of the etching sequence illustrated in FIGS. 6a–6c.
Figure 8:
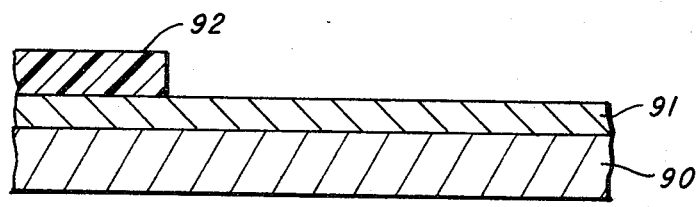
FIG. 8 is a sectional view of a substrate having aluminum and photoresist layers disposed thereon after receiving an ozone de-scumming treatment in accordance with the present invention to remove residual photoresist material from areas of the aluminum layer to be etched.

FIG. 8 is a sectional view of a semiconductor slice having an aluminum layer 91 and a patterned photoresist layer 92 disposed on a semiconductor substrate 90 after a flash treatment of ozone has been applied thereto to remove the photoresist residue, FIG. 8 being otherwise similar to FIG. 6a. This "de-scumming" of photoresist residue from the surface of the aluminum layer 91 virtually eliminates the problem illustrated in FIG. 7 in that hydrogen bubbles generated by the reaction between the surface of the aluminum layer 91 and the TIL acid etchant are relatively small and easily dispersed into the solution of the dissolved aluminum and the reacted acid etchant. Semiconductor slices having an aluminum layer and a patterned photoresist layer thereon look cleaner after subjection to the flash ozone treatment, i.e., the surface of the aluminum layer 21 is more reflective than an untreated aluminum surface on a semiconductor slice as depicted in FIG. 6a. Larger hydrogen bubbles tend to form on semiconductor slices where the residual photoresist material remains on the aluminum layer from the reaction between the acid etchant and the aluminum, these larger hydrogen bubbles having a tendency to cling to the surface of the aluminum layer 91. In comparison, treatment of the semiconductor slice with a flash ozone treatment to remove the residual photoresist material from the surface of the aluminum layer 91 as illustrated in FIG. 8 results in generally smaller hydrogen bubbles being formed on the surface of the aluminum layer 91 during the etching thereof with the TIL acid etchant. These smaller hydrogen bubbles have a lesser tendency to cling to the surface of the aluminum layer 91, and with slight agitation readily release therefrom. Semiconductor slices having an aluminum layer and a patterned photoresist layer disposed thereon have been treated at approximately 130° C. for 30-60 seconds with ozone to clean the surface of the aluminum layer by removing residual material remaining from the opened areas of the developed photoresist layer. In addition, this flash ozone technique substantially decreases photoresist "feathering" at the boundary of the photoresist mask remaining after development thereof. The reduction of this "feathering" enhances the sharpness of the photoresist pattern edge, thereby improving the sharpness of the metal line edge of the aluminum layer after etching of the portion of the aluminum layer to be removed has been completed.

Thus, it will be seen that a high performance technique has been disclosed for the removal of photoresist material from a substrate, wherein ozone is the active reagent in removing the photoresist material. The procedure is susceptible to either batch use as applied to a given number of substrates having photoresist layers to be removed during each ozone treatment cycle, or to a continuous automated procedure wherein substrates having photoresist layers are serially fed into and out of a reaction zone where they are subjected to ozone contained in a gaseous atmosphere. Several embodiments of apparatuses have also been disclosed, wherein various aspects of this ozone treatment method for photoresist removal may be implemented.

Although preferred embodiments of the invention have been specifically described, it will be understood that the invention is to be limited only by the appended claims, since variations and modifications of the preferred embodiments will be apparent to those skilled in the art.

What is claimed is:

1. In the fabrication of an electronic structure, a method for removing a layer of photoresist material from a substrate surface of different material, said method comprising:

positioning the substrate on which the photoresist layer is disposed in a reaction zone of a reactor, introducing a gaseous atmosphere containing ozone as an active reagent in an amount sufficient to react with all of the photoresist material in said layer thereof into the reaction zone of said reactor, exposing said layer of photoresist material to said ozone-containing gaseous atmosphere, removing photoresist material from the underlying substrate surface in response to exposure of the layer of photoresist material to the ozone while continuously maintaining a sufficient concentration of ozone molecules in the area of the photoresist material at least until the layer of photoresist material is removed, flowing streams of an inert gaseous atmosphere at the inlet and outlet sides of the reaction zone of said reactor to confine the ozone-containing gaseous atmosphere within the reaction zone after the introduction thereof and to restrict the exhaust of excess ozone and reaction products to a predetermined exhaust path, and exhausting excess ozone and reaction products including the photoresist material of the removed layer from the reactor along the predetermined exhaust path.

2. In the fabrication of an electronic structure, a method of removing a layer of photoresist material from a substrate surface of different material, said method comprising:

continuously serially feeding substrates having layers of photoresist material thereon into a reaction zone of a reactor by controllably directing air jets onto successive ones of said substrates to impart movement thereto along a predetermined path which traverses the reaction zone of said reactor, introducing a gaseous atmosphere containing ozone as an active reagent in an amount sufficient to react with all of the photoresist material in each of said layers thereof on the respective substrates into the reaction zone of said reactor, sequentially exposing the respective layers of photoresist material on said substrates to said ozone-containing gaseous atmosphere as said substrates successively traverse the reaction zone of said reactor for removal of the respective layers of photoresist material, respectively removing photoresist material from the underlying substrate surface of each substrate in response to exposure of the layer of photoresist material to the ozone while continuously maintaining a sufficient concentration of ozone molecules in the area of the photoresist material at least until the layer of photoresist material is removed, and exhausting excess ozone and reaction products including the photoresist material of the removed layers from the reactor.

3. In the fabrication of an electronic structure, a method of removing a layer of photoresist material from a substrate surface of different material, said method comprising:

positioning the substrate on which the photoresist layer is disposed in a reaction zone of a reactor, heating the photoresist layer on said substrate to a predetermined temperature elevated above ambient temperature, introducing a gaseous atmosphere containing ozone as an active reagent in an amount sufficient to react with all of the photoresist material in said layer thereof into the reaction zone of said reactor, maintaining the ozone-containing gaseous atmosphere at approximately ambient temperature during its introduction into the reaction zone of said reactor while the photoresist layer is maintained at said elevated temperature by cycling coolant material about an inlet which communicates with the reaction zone of said reactor and through which the ozone-containing gaseous atmosphere is introduced into the reaction zone of said reactor, exposing said layer of photoresist material to said ozone-containing gaseous atmosphere, removing photoresist material from the underlying substrate surface in response to exposure of the layer of photoresist material to the ozone while continuously maintaining a sufficient concentration of ozone molecules in the area of the photoresist material at least until the layer of photoresist material is removed, and exhausting excess ozone and reaction products including the photoresist material of the removed layer from the reactor.

* * * * *